United States Patent
Hellberg (10) Patent No.: US 10,469,034 B2
(45) Date of Patent: Nov. 5, 2019

(54) AMPLIFIER CIRCUIT FOR COMPENSATING AN OUTPUT SIGNAL FROM A CIRCUIT

(71) Applicant: Telefonaktiebolaget LM Ericsson (publ), Stockholm (SE)

(72) Inventor: Richard Hellberg, Huddinge (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 15/767,384

(22) PCT Filed: Nov. 9, 2015

(86) PCT No.: PCT/SE2015/051182
§ 371 (c)(1),
(2) Date: Apr. 11, 2018

(87) PCT Pub. No.: WO2017/082776
PCT Pub. Date: May 18, 2017

(65) Prior Publication Data
US 2018/0302041 A1    Oct. 18, 2018

(51) Int. Cl.
*H03F 3/68*    (2006.01)
*H03F 1/02*    (2006.01)
(Continued)

(52) U.S. Cl.
CPC ......... *H03F 1/0288* (2013.01); *H03F 1/3223* (2013.01); *H03F 1/3229* (2013.01);
(Continued)

(58) Field of Classification Search
CPC ............. H03F 3/68; H03F 2203/21106; H03F 1/0288; H03F 1/3252; H03F 3/19;
(Continued)

(56) References Cited

U.S. PATENT DOCUMENTS 3,886,470 A * 5/1975 O'Neil .................. H03F 1/3229
330/124 R
4,359,696 A * 11/1982 Gerard ...................... H03F 1/20
330/149

(Continued)

FOREIGN PATENT DOCUMENTS

| RU | 2294052 C9 | 6/2007 |
| RU | 2011129994 A | 1/2013 |
| RU | 2562420 C2 | 9/2015 |

OTHER PUBLICATIONS

Byrne, J. et al., "A Highly Directive, Broadband, Bidirectional Distributed Amplifier", Microwave Symposium Digest, Jun. 13, 1989, pp. 427-430, vol. 1, IEEE.

(Continued)

*Primary Examiner* — Khanh V Nguyen
(74) *Attorney, Agent, or Firm* — Coats + Bennett, PLLC (57) ABSTRACT

An amplifier circuit (200) for compensating an output signal provided at an output (212) of a circuit (210) is disclosed. The amplifier circuit (200) comprises an output transmission line (230) connected between the output (212) of the circuit (210) and an output port (240) and an amplifier (220). The amplifier (220) comprises multiple sub-amplifiers (221, 222, 223, 224), inputs of the multiple sub-amplifiers (221, 222, 223, 224) are coupled to an input transmission line (250) for receiving an error signal; and outputs of the multiple sub-amplifiers (221, 222, 223, 224) are coupled at respective places along the output transmission line (230) to inject a compensation signal to the output port (240). The error signal is derived from a reference input signal and the output signal of the circuit (210), and is amplified in the amplifier (220) into the compensation signal.

11 Claims, 8 Drawing Sheets

(51) Int. Cl.
*H03F 1/32* (2006.01)
*H03F 3/24* (2006.01)
*H03F 3/60* (2006.01)
*H03F 3/19* (2006.01)
*H03F 3/21* (2006.01)

(52) U.S. Cl.
CPC ............ *H03F 1/3252* (2013.01); *H03F 3/19* (2013.01); *H03F 3/21* (2013.01); *H03F 3/245* (2013.01); *H03F 3/602* (2013.01); *H03F 3/605* (2013.01); *H03F 3/211* (2013.01); *H03F 2200/171* (2013.01); *H03F 2200/192* (2013.01); *H03F 2200/195* (2013.01); *H03F 2200/228* (2013.01); *H03F 2200/315* (2013.01); *H03F 2200/423* (2013.01); *H03F 2200/451* (2013.01); *H03F 2201/3215* (2013.01)

(58) Field of Classification Search
CPC .......... H03F 3/21; H03F 1/3223; H03F 3/245; H03F 3/602; H03F 1/3229; H03F 3/605; H03F 2200/171; H03F 2200/228; H03F 2200/195; H03F 2200/192; H03F 2200/315; H03F 2200/451; H03F 2201/3215; H03F 2200/423; H03F 3/607; H03F 3/60

USPC .......................................... 330/54, 286, 295
See application file for complete search history.

(56) References Cited

U.S. PATENT DOCUMENTS

| | | | |
|---|---|---|---|
| 4,797,628 A | | 1/1989 | Gruchalla et al. |
| 4,973,918 A | | 11/1990 | Schindler |
| 5,055,795 A | * | 10/1991 | Kasper ............ H04L 25/03038 330/149 |
| 6,556,080 B1 | * | 4/2003 | Stengel ................ H03F 1/3223 330/151 |
| 6,573,792 B1 | | 6/2003 | Olson et al. |
| 7,477,102 B1 | | 1/2009 | Ellis et al. |
| 8,471,632 B2 | | 6/2013 | Onishi et al. |

OTHER PUBLICATIONS

Siedel, H., "A Microwave Feed-Forward Experiment", Manuscript, revised Apr. 12, 1971, The Bell System Technical Journal, Nov. 1, 1971, pp. 2879-2916, vol. 50, No. 9, US.

Ginzton, E. et al., "Distributed Amplification", Proceedings of the IRE, Aug. 1, 1948, pp. 956-969, vol. 36, Issue: 8, IEEE.

* cited by examiner

AMPLIFIER CIRCUIT FOR COMPENSATING AN OUTPUT SIGNAL FROM A CIRCUIT

TECHNICAL FIELD

Embodiments herein relate to an amplifier circuit for compensating an output signal from a circuit by injecting a compensation signal. Furthermore, radio network nodes and user equipments in wireless communication systems, and electronic devices in general comprising the amplifier circuit are disclosed.

BACKGROUND

Power amplifiers are widely used for example in radio base stations and user equipments in wireless communication systems. Power amplifiers typically amplify input signals of high frequencies into an output signal ready for radio transmission. High efficiency and linearity are generally desirable for power amplifiers to reduce power consumption and minimize errors and/or distortions in the output signal.

Known error or distortion correction techniques for power amplifiers include feedback, pre-distortion and feedforward techniques. Of these, only so called adaptive pre-distortion and feedforward techniques are viable for systems having wide bandwidth and with tough linearity requirements.

Adaptive pre-distortion, typically used in digital implementations, is a linearization technique that works by providing an inversely nonlinear signal to the input of a nonlinear amplifier so that the output signal becomes linear. To shape the nonlinear input signal to the amplifier, the adaptive pre-distortion technique uses sampling of the amplifier's output signal together with nonlinear modeling and adaptive signal processing. A major benefit of this technique is that the efficiency of the amplifier is almost unaffected.

However, the adaptive digital pre-distortion technique cannot counteract noise and handles several types of distortion poorly, or not at all. The pre-distortion signal generally has much higher bandwidths than the final output signal, especially for compression, low or negative gain slope regions and sharp kinks in the transfer function. Digital pre-distortion systems need a correct set of model parameters, which sometimes is hard to determine. A specific set of model parameters might not work in practice if the produced amplifiers behave differently than the model. The signal processing complexity, and consequentially the size and power consumption, can be high for complex error processes. These problems are exacerbated by requirements for high bandwidths and low distortion.

Figure 1:
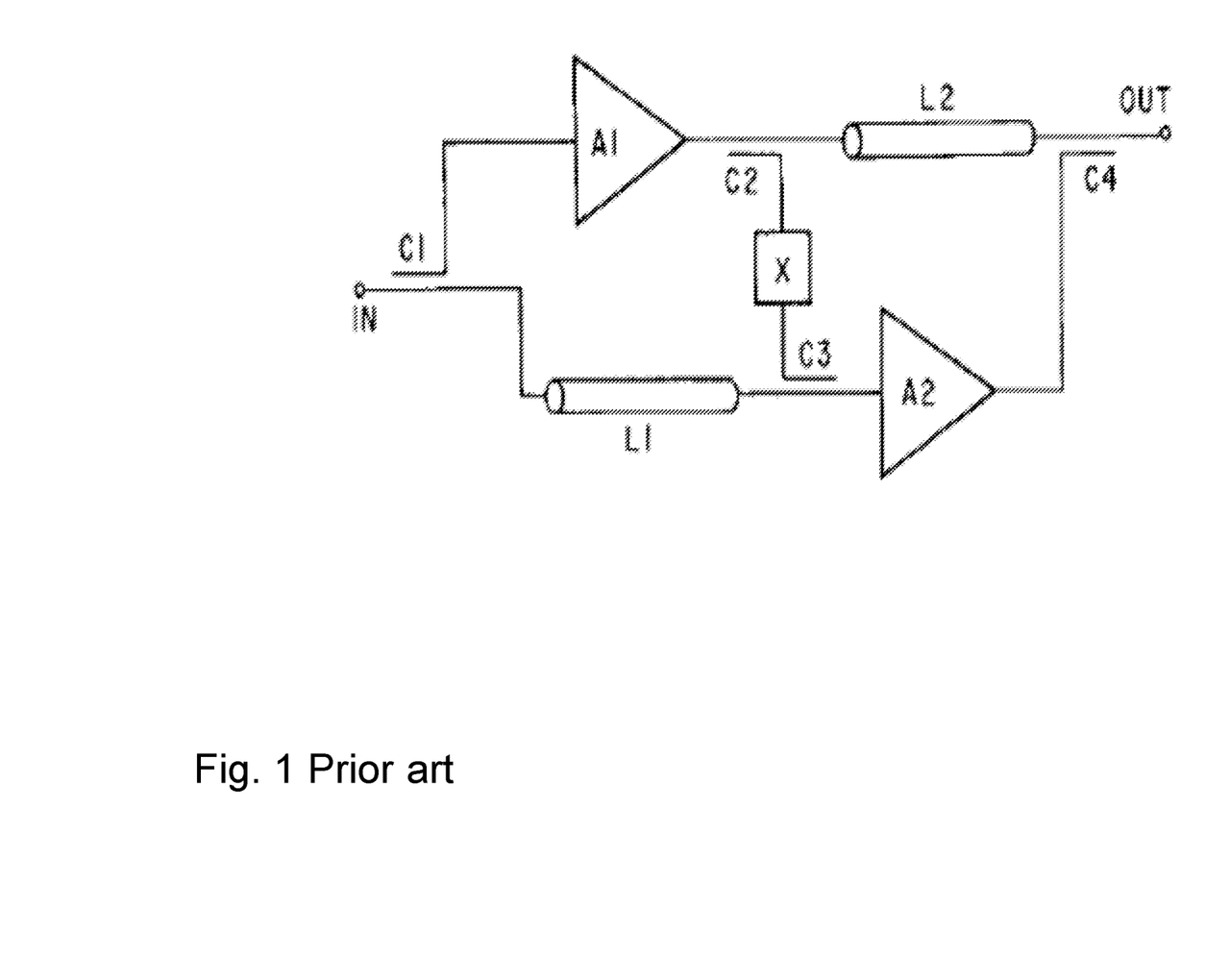
FIG. 1 is a schematic block diagram illustrating a feedforward system according to prior art.

Feedforward, e.g. described in Seidel, H., "A microwave feed-forward experiment," Bell System Tech. J., pp. 2879-29 16, Nov. 1971, is a linearization technique that works by injecting a corrective signal after a main amplifier A1 to restore linearity, as shown in FIG. 1. With this method error extraction is done by a first signal sampling coupler C3 shown in FIG. 1. An amplified output signal from the main amplifier A1 is sampled by a signal sampling coupler C2, the first signal sampling coupler C3 then compares the sampled signal with a reference input signal IN and outputs an error signal. The reference input signal IN is delayed by a transmission line or a delay filter L1 in order to be in sync with the amplified output signal from the main amplifier A1. The error signal is then amplified by an error amplifier A2 to a corrective or compensation signal and injected by C4 to an output OUT. A delay line L2 after the main amplifier A1 ensures that the corrective, or compensation, signal is injected in sync with the output signal from the main amplifier A1. The box marked with X may be an inversion, or inverter, in the cases where the main amplifier A1 is a non-inverting amplifier. Feedforward systems are often described in terms of "loops", i.e. an error extraction loop followed by an error injection loop.

Error injection performed by element C4 in FIG. 1 is handled by either a transformer or a directional coupler. The directional coupler has the advantage that it has high backwards isolation, i.e. the injected signal mainly goes forward to the output, whereas the transformer sends half of the injected signal power back towards the main amplifier A1.

Due to limited precision in gains, phases and delays, two or more feedforward stages are usually required to reduce the error to specified levels even if the loops are adaptively adjusted. A feedforward stage is also commonly used to complement a pre-distortion system to handle the "difficult" types of errors.

Feedforward method can handle any type of errors, e.g. noise, gain, frequency response variations and all types of distortions including nonlinear memory effects with arbitrary time constants, negative gain regions and even hysteresis. It can do this at high frequencies, over wide bandwidths and without knowledge of the specific error processes involved. It therefore has advantages over pre-distortion techniques both when it comes to the types of errors that can be handled and bandwidth. Since feedforward method also corrects for noise in the main amplifier path, high-selectivity high-power filters after the main amplifier may be eliminated in a well-designed feedforward system. The noise and distortion requirements on the pre-distortion part of a combined pre-distortion-feedforward system may also be relaxed.

However, a drawback of the feedforward method is low efficiency. This is to a large extent due to losses in the error injection coupler and low efficiency of the error amplifier. Usually, large losses in the error injection coupler and low efficiency in the error amplifier will result if the maximum error signal, either in voltage or current, needs to be handled is large. These losses behave differently for transformer couplers and directional couplers. Other losses and inefficiency come from the delay line after the main amplifier, the signal sampling couplers, and limited precision in loop balancing with respect to gains, phases and delays. This means that the error amplifiers must have headroom to accommodate residual signal instead of only the error signal.

Transformer coupling has no specific coupler loss, but influences the efficiency of the error amplifier. It has larger loss for low amplitude signal in the main path. That will lower efficiency for the error amplifier, since the error amplifier is not isolated from it. Large loss also comes from sending half of the injected signal power in the wrong direction. The part of the injected signal that goes backwards reflects at and interacts with the main amplifier which gives rise to new distortion products and ripples in the output signal, which is known as interaction problems. Due to these problems the transformer coupling method has been substantially abandoned in favor for the directional coupler method.

A directional coupler has close to zero coupling loss for injected signals that are in phase with and proportional, by a coupling factor, to the output signal from the main amplifier, but has high loss for injected signals that are far away from these conditions. Even if the error in the output signal is zero, the directional coupler dumps part of the output signal power from the main amplifier into a resistance. It however does not have a specific penalty for signals with low amplitude in the main path, since the error amplifier is isolated from it by the directional coupler. Furthermore, the average efficiency of the error amplifier is low if the error in the output signal is small on average compared to the maximum error.
→3a

SUMMARY

An object of embodiments herein is therefore to provide an improved amplifier circuit for error or distortion correction of a signal output from a circuit, such as a main amplifier as mentioned above.

According to an aspect, the object is achieved by an amplifier circuit for compensating an output signal provided at an output of a circuit. The amplifier circuit comprises an output transmission line connected between the output of the circuit and an output port. The amplifier circuit further comprises an amplifier comprising multiple sub-amplifiers, inputs of the multiple sub-amplifiers are coupled to an input U.S. Pat. No. 6,573,792 disclose a feedforward amplifier using a direct coupling of an amplifier stage with the amplifier's load. The main amplifier is coupled through a transmission line to the load. This direct coupled amplifier stage is driven by a signal that induces a very low impedance in parallel with the load to the error signal, but appears as an open circuit to the desired signal so that the desired signal from the main amplifier is substantially unaffected.

In Byrne J. al. "A highly directive, broadband, bidirectional distributed amplifier", Microwave Symposium Digest, 1989, IEE MTT-S International, IEEE, 13 June 1989, design considerations for developing a highly directive broadband bidirectional distributed amplifier are discussed. Through effective binomial scaling of the individual device transconductances, directivities on the order of –25 to –35 dB have been demonstrated. The circuit is broadband with the potential for operation over an octave or more in frequency.

U.S. Pat. No. 4,973,918 disclose a radio frequency distributed circuits combining the functions of amplifying, switching and splitting signals. The circuit includes a plurality of field effect transistors. Since the first and second channels of transistor are successively coupled by transmission lines, the reactance of said lines may be taken into consideration to provide very broadband amplifying switch and signal splitting circuits.

U.S. Pat. No. 4,797,628 provide a modified distributed amplifier which is capable of providing push-pull operation without the loading losses of conventional push-pull combining. The modified distributed amplifier comprises a distributed amplifier configuration with signal inverting means, such as a wide bandwidth transmission line transformer, interconnected into both the input and output lines. transmission line for receiving an error signal, and outputs of the multiple sub-amplifiers are coupled at respective places along the output transmission line to inject a compensation signal to the output port. The error signal is derived from a reference input signal and the output signal of the circuit, and the error signal is amplified in the amplifier into the compensation signal.

The amplifier circuit according to embodiments herein may be a directional amplifier which replaces the error amplifier and transformer or directional coupler in a prior art feedforward system as described above. Since the amplifier circuit according to embodiments herein comprises multiple sub-amplifiers distributed at different places along the output transmission line to inject the compensation signal to the output port, the number of sub-amplifiers, the output signals from the sub-amplifiers and the distance between the different places along the output transmission line may be configured to reduce the portion of the injected compensation signal that travels back towards the output of the circuit. This will at the same time increase the corrective capability in the forward direction to the output port. Further, the number of sub-amplifiers has a relation to the bandwidth and efficiency of the amplifier. Therefore, the number of sub-amplifiers may be configured so that high efficiency over a wide range of the error signal amplitudes and over a large relative bandwidth may be achieved. Moreover, the number of sub-amplifiers also has a relation to the directivity, for example, if higher directivity is desired, more sub-amplifiers over a longer output transmission line may be implemented.

Therefore, the amplifier circuit according to embodiments herein simultaneously achieves low insertion loss of the transformer coupling circuit and high backwards isolation of the directional coupler circuit. It has higher efficiency and fewer interaction problems than the prior art transformer coupling circuit. It has higher efficiency than the directional coupler circuit for error signals with high peak-to average power ratio and for hard compression in the circuit. The cost of over-dimensioning, to safely handle large transient error signal magnitudes, is also lower.

BRIEF DESCRIPTION OF THE DRAWINGS

The various aspects of embodiments disclosed herein, including particular features and advantages thereof, will be readily understood from the following detailed description and the accompanying drawings, in which.

DETAILED DESCRIPTION

Throughout the following description similar reference numerals have been used to denote similar features, such as elements, units, modules, circuits, nodes, parts, items or the like, when applicable.

Figure 2:
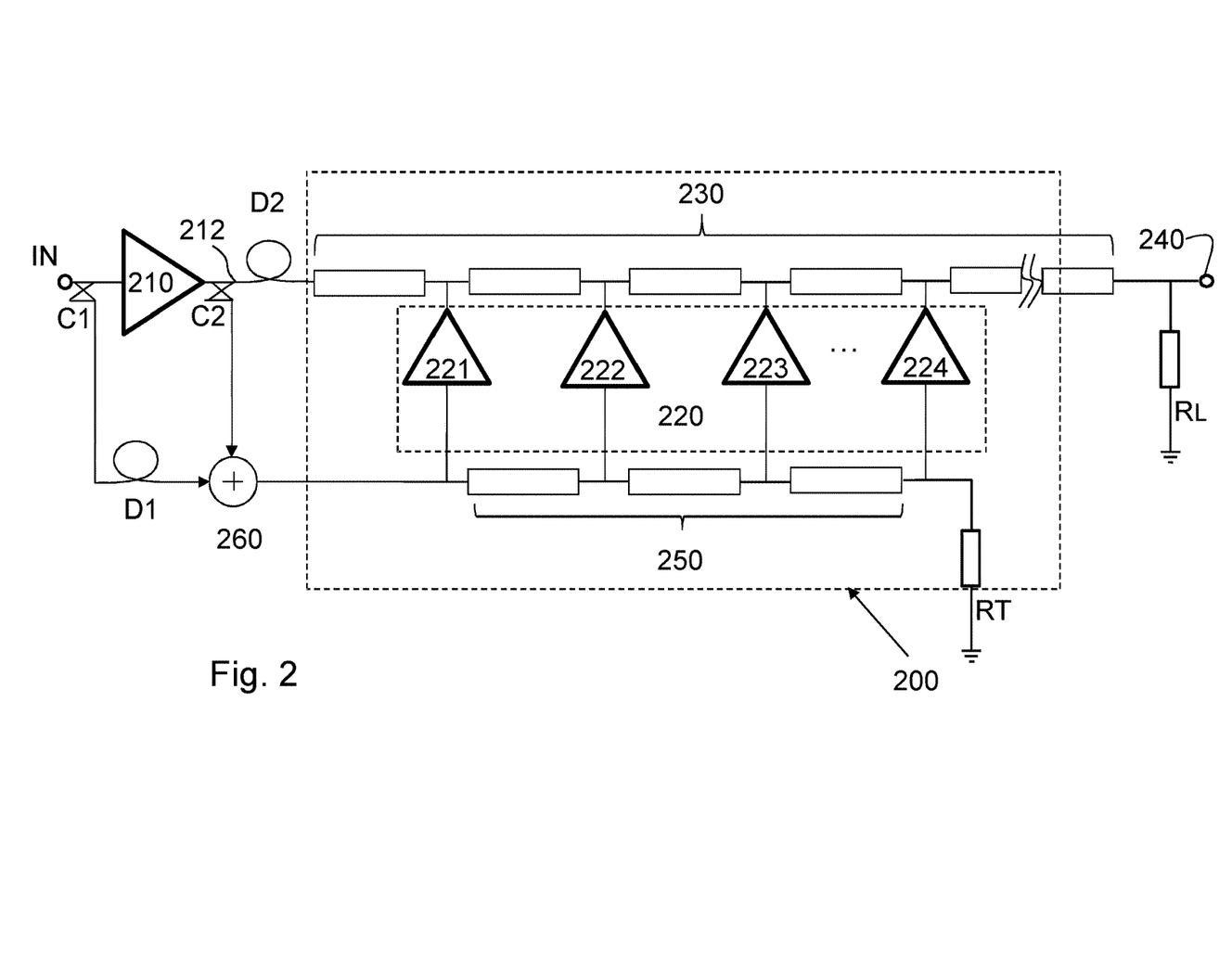
FIG. 2 is a schematic block diagram illustrating an example of an amplifier circuit according to embodiments herein.

FIG. 2 illustrates an example of an amplifier circuit 200 according to embodiments herein for compensating an output signal provided at an output 212 of a circuit 210. The circuit 210 may be a power amplifier, a filter, a circulator, a mixer or any type of circuit for which its output signal needs to be corrected or compensated.

The amplifier circuit 200 comprises an output transmission line 230 connected between the output 212 of the circuit 210 and an output port 240.

The amplifier circuit 200 further comprises an amplifier 220 for amplifying an error signal to a compensation signal.

The error signal is derived from a reference input signal and the output signal of the circuit 210 e.g. by comparing them in a combination circuit 260. The reference input signal may be a standalone reference signal or may be taken out or split from the input signal IN to the circuit 210. There are different ways of deriving the input and output signals from the circuit 210. One example is using coupler C1, C2 as show in FIG. 2.

The amplifier 220 comprises multiple sub-amplifiers 221, 222, 223, 224. As shown in FIG. 2, inputs of the multiple sub-amplifiers 221, 222, 223, 224 are coupled to an input transmission line 250 for receiving the error signal, and outputs of the multiple sub-amplifiers 221, 222, 223, 224 are coupled at respective, i.e. different, places along the output transmission line 230 to inject the compensation signal to the output port 240. The compensated output signal is then provided at the output port 240.

The output transmission line 230 is terminated at the output port 240 by a load resistance $R_L$. The load resistance $R_L$ may represent impedances of an antenna, transmission line, isolator or/and filter etc. coupled to the output port 240.

The input transmission line 250 is terminated by a resistance $R_T$ to reduce, or even minimize, reflections on the input transmission line 250.

Elements D1, D2 are delay lines to synchronize the signals. They are important if the circuit 210 has large delay, for example when using multiple stages for high gain. They are however not always necessary. D2 for example is probably unnecessary in many cases if there isn't any amplifier in the drive path to the amplifier 220.

The outputs of the sub-amplifiers may preferably be connected directly to the output transmission line 230 or may be connected to the output transmission line 230 via some intermediate means or coupling circuits.

Therefore, according to one embodiment, the outputs of the multiple sub-amplifiers 221, 222, 223, 224 are coupled directly to the output transmission line 230 at different places as shown in FIG. 2. According another embodiment, the outputs of the multiple sub-amplifiers 221, 222, 223, 224 are coupled to the output transmission line 230 via coupling circuits. The coupling circuits may be half-wavelength networks such as cascaded pi- or T-networks consists of half-wavelength of transmission lines or lumped or distributed impedance transformers. Use of half-wavelength networks generally limits the achievable bandwidth but enables a freer choice of impedance level.

Since it is usually difficult to access the output node of some amplifier transistors in the circuit 210 directly, a half-wavelength network is a viable way to couple the multiple sub-amplifiers to the output of the circuit 210. Using the half-wavelength network makes it easy to access the output node and at the same time the parasitic of the transistors may be taken into account. Thus, the first part of the half-wavelength network may consist of the parasitic or other unavoidable elements of the transistors. Parasitic elements at the transistors may also be incorporated in the design of a synthetic output transmission line.

Transformer coupling may also be feasible. A difference from prior art is that there are now multiple sub-amplifiers being coupled by transformers to the different places along the output transmission line 230.

Since the amplifier 220 comprises multiple sub-amplifiers 221, 222, 223, 224 distributed at different places along the output transmission line to inject the compensation signal to the output port, the number of sub-amplifiers, the output signals from the multiple sub-amplifiers and the distance between the different places may be configured to reduce the portion of the injected compensation signal that travels back towards the output of the circuit and to improve the efficiency of the amplifier circuit 200.

In the following, functions, features, configurations and advantages of the amplifier circuit 200 will be discussed in detail with reference to different examples and implementations.

According to some embodiments, a distance between the different places along the output transmission line 230 may be configured to have a quarter wavelength at a center frequency of the operating frequency band of the circuit 210. For example, as shown in FIG. 2, the multiple sub-amplifiers 221, 222, 223, 224 are coupled to the output transmission line 230 at regular intervals which is a quarter wavelength at the center frequency of the band of interest, i.e. the operating bandwidth of the circuit 210. These intervals are also referred as segments of the output/input transmission lines between the sub-amplifiers. Correct timing of the error signals, i.e. to be in sync with the output signal from the circuit 210, is achieved by using quarter wavelength intervals also on the input transmission line 250.

According to some embodiments, the multiple sub-amplifiers 221, 222, 223, 224 may be configured to reduce backwards traveling of the compensation signal to the output 212 of the circuit 210.

For example, output currents from the multiple sub-amplifiers 221, 222, 223, 224 may be configured so that amplitudes of the output currents resembles a bell-shape of a window function. The window function may be, e.g. any one of Dolph-Chebyshev, Gaussian, Binomial, Hamming, Blackman functions or other similar functions, or even a combination thereof.

The aim of the bell-shaping of the output currents from the sub-amplifiers is primarily to keep the side lobe level of the frequency response of the backwards traveling wave low at frequencies above the lower frequency edge of the operating bandwidth, since that determines how much backwards traveling wave power that gets to the output of the circuit 210. In this way, the backwards traveling waves is reduced, or even minimized, within the band of interest. This bell-shape weighted output currents also give low ripple both at the output port 240 and for the sub-amplifiers' output voltage amplitudes over a specified bandwidth. By proper timing of their respective drive signals, i.e. the error signals, the sub-amplifier's contributions to the output voltage swing add synchronously in time, i.e. in phase, in the forward direction along the output transmission line 230 towards the output port 240. The backwards traveling waves have time differences that make the sum of the output voltages from the sub-amplifiers appear low-pass filtered and appear only like a small ripple for the input signals within the bandwidth of operating frequencies.

Figure 3:
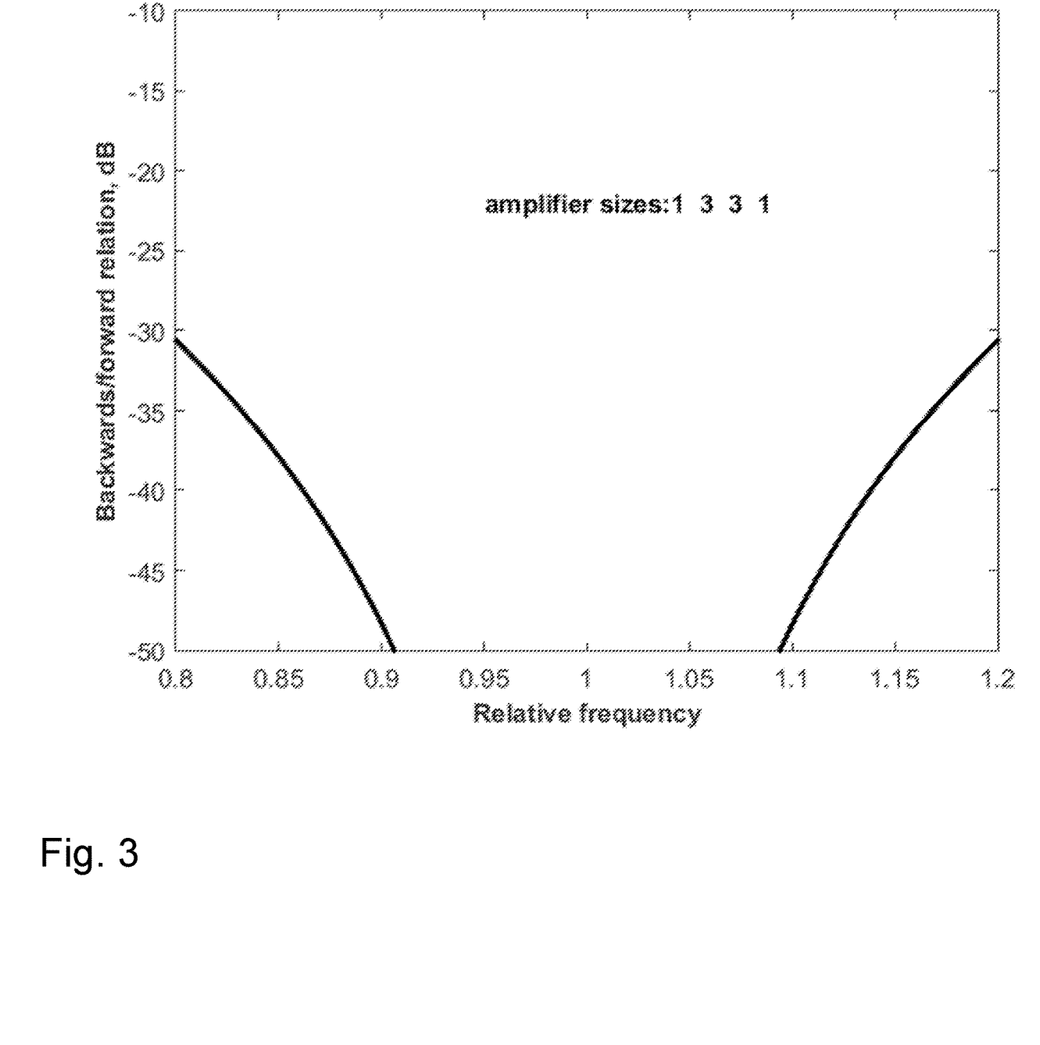
FIG. 3 is a diagram illustrating the directionality of the amplifier circuit in FIG. 2.

Binomial weightings are often used since they consist of small integers, the amplifier 220 may thus be put together by a small number of unit- or discretely-small-integer sized sub-amplifiers without wasting any output current capability. As one example, the amplifier 220 comprises four sub-amplifiers 221, 222, 223, 224, the output currents from the four sub-amplifiers are weighted with 1, 3, 3, 1 weighting coefficients, i.e. the output currents from the two sub-amplifiers 222, 223 in the middle are 3 times to the output currents from the two sub-amplifiers 221, 224 at each side. The directionality, i.e. the backward wave power divided by the forward wave power, of the amplifier 220 is shown in FIG. 3. It can be seen that it is better than 30 dB in a 40% bandwidth. In this example, the segments of the output transmission line is a quarter wavelength and have constant characteristic impedance, and the amplifier 220 is dimensioned to handle error signals which are as large as half of the maximum desired output signal amplitude.

Figure 4A:
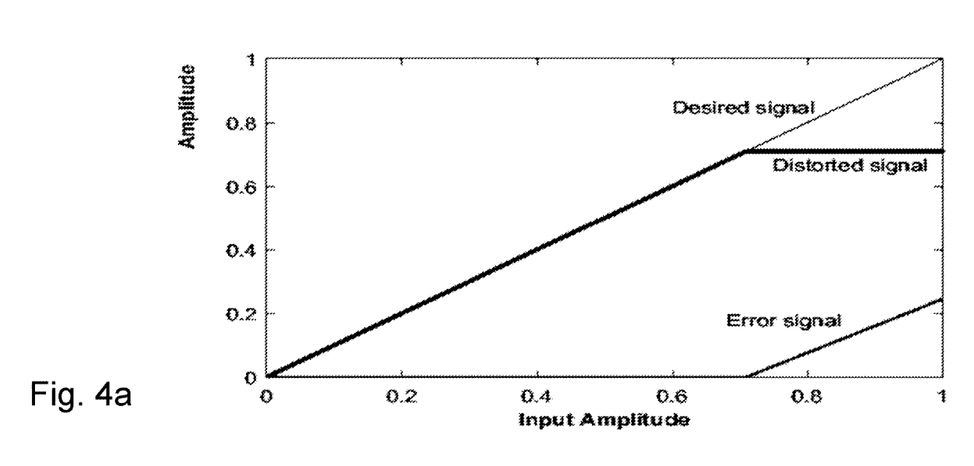
FIG. 4a is a diagram illustrating an example of output signal and error signal.
Figure 4B:
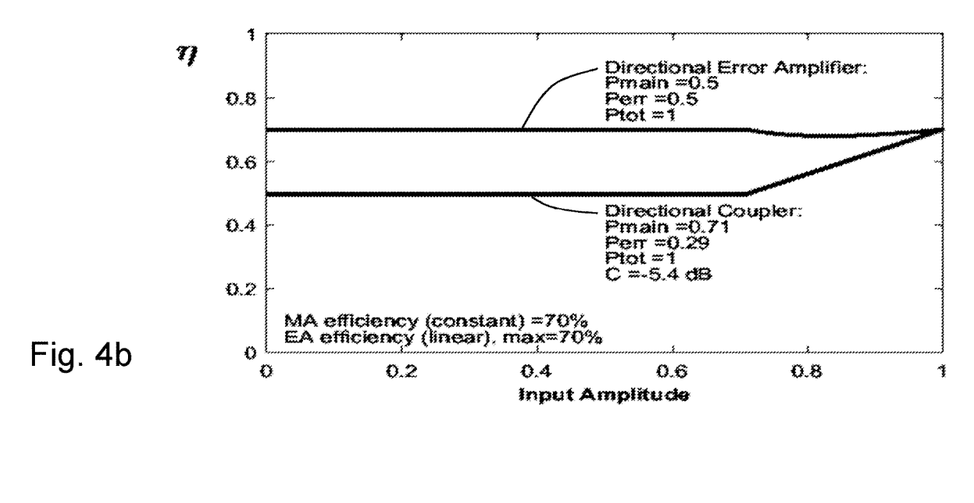
FIG. 4b is a diagram illustrating compensating efficiencies from the amplifier circuit in FIG. 2 and the conventional method.

In FIG. 4a, an example of a desired output signal, the distorted output signal from the circuit 210, and the error signal, i.e. the compensation signal to be inserted are shown. The hard compression starts at 0.71 of the full input signal amplitude. FIG. 4b shows compensating efficiencies form the amplifier circuit 220 and the conventional method in a situation that large compression nonlinearity occurs. The differences between the present embodiment and the conventional method can be seen in FIG. 4b. The top trace shows the efficiency of the embodiment herein over the full input signal amplitude range, while the bottom trace shows the efficiency for the conventional method without over-dimensioning. The main amplifier, i.e. the circuit 210, is modelled as having constant efficiency of 70% at all input signal amplitudes, while the error amplifiers for both methods are modelled as having efficiency proportional to the output signal voltage amplitude, with the maximum efficiency of 70%.

Due to the large size of the error signal caused by the hard compression, the coupler loss is very large for the conventional method, which severely lowers the efficiency for the input signal amplitudes lower than 0.71 of the full input signal amplitude. The efficiency rises linearly in the upper input signal amplitude range where the error signal increases, and achieves 70% efficiency at the maximum input signal amplitude where perfect combination in the coupler occurs.

The embodiment herein has no coupler loss and thus does not suffer any lowering of the efficiency in the input signal amplitude range lower than 0.71 of the full input signal amplitude. The efficiency has a small downward shift in the upper input signal amplitude range due to the lower efficiency of amplifying the error signal at lower than the maximum output voltage level in the amplifier 220. The efficiency at the maximum input signal amplitude is back at 70%.

Figure 5:
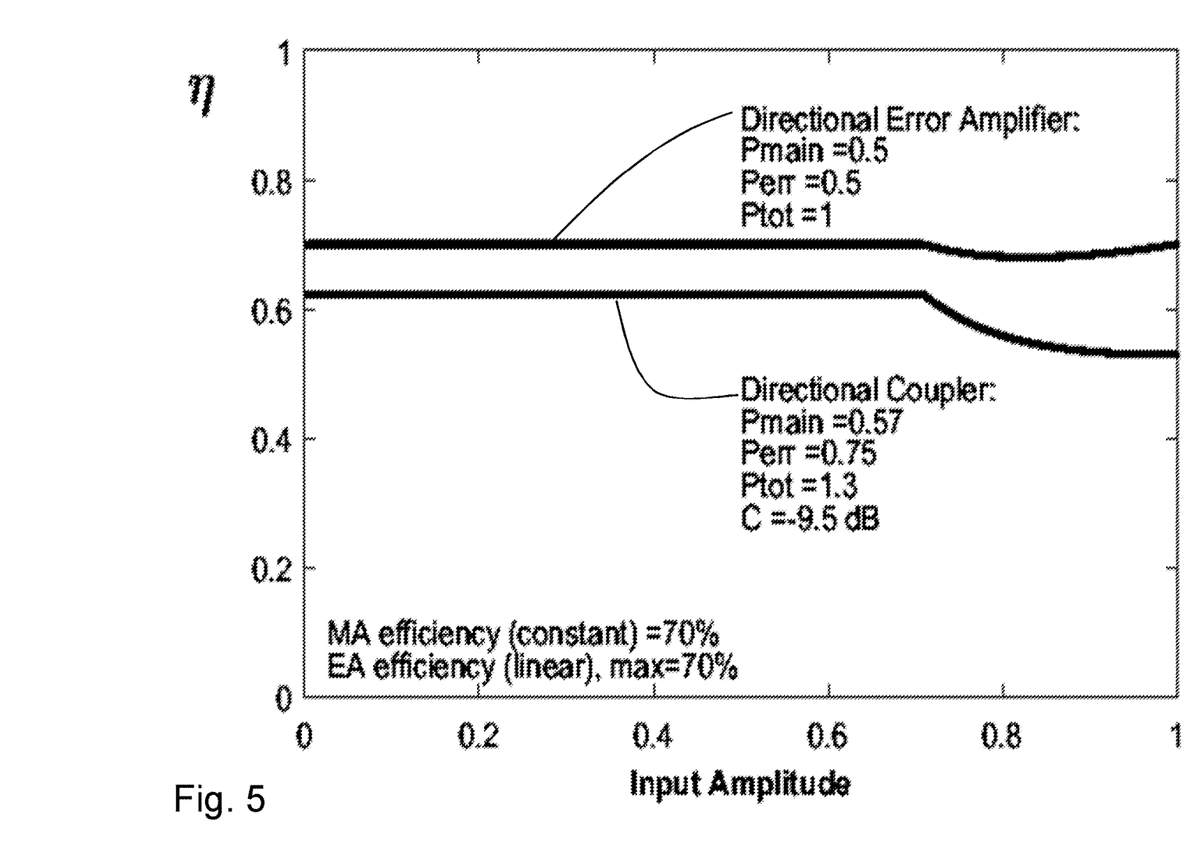
FIG. 5 is a diagram illustrating compensating efficiencies from the amplifier circuit in FIG. 2 and the conventional method with decreased coupling factor.

By reducing the coupling factor the coupler loss is decreased and the efficiency of the conventional method can thus be increased. This is however only possible by over-dimensioning with regard to the total provided power, and is thus costly for all but small efficiency increases. An example is shown in FIG. 5, where the coupling factor has been decreased from −5.4 dB in the previous example to −9.5 dB in this example.

It can be seen that the efficiency is increased in the input signal amplitude range lower than 0.71 of the full input signal amplitude, but decreased for the input signal amplitude larger than 0.71 of the full input signal amplitude. The power from the main amplifier, Pmain, is lowered by 20% from 0.71 to 0.57 of the total output power due to less power being diverted in the coupler, but at the same time the power from the error amplifier, Perr, has increased by a factor of 2.6, from 0.29 to 0.75. The total power capability needed is now 30% higher than in the original system. This method only asymptotically approaches the main amplifier efficiency in the lower input signal amplitude range by further lowering the coupling factor, at increasingly higher cost. The average efficiency also suffers from the lowering of the efficiency in the upper input signal amplitude range. Lower coupling loss can also be achieved by feeding also input signal to the error amplifier. Unfortunately this also has high costs in over-dimensioning and the increased efficiency from lower coupling loss is largely counteracted by the low efficiency of the error amplifier at low input signal amplitudes unless the error amplifier is replaced by an amplifier with comparable efficiency to the main amplifier.

It has been shown that the number of sub-amplifiers has a relation to the bandwidth of the amplifier 220, its directivity and efficiency. Thus the number of sub-amplifiers may be configured so that good directivity and high efficiency over a wide range of the error signal amplitudes and over a large relative bandwidth may be achieved.

Therefore, depending on the desired bandwidth and directivity, the amplifier 220 may be implemented with few or many sub-amplifiers. The frequency range of good directivity generally decreases with decreasing numbers of sub-amplifiers. If higher directivity is desired, more sub-amplifiers over a longer output transmission line may be implemented. Bell-shaping of the output currents from the sub-amplifiers along the output transmission line 230 gives shorter total length for a given specification. Keeping the total length of the output transmission line short is generally good since there is always a loss per unit length of the transmission line. The tradeoffs between the positive and negative aspects of having many or few sub-amplifiers vary with implementation technology.

In the following, example directional amplifier which uses fewer sub-amplifiers than in the previous example will be discussed. According to one embodiment, the amplifier 220 comprise three (3) sub-amplifiers 221, 222, 223 with output currents weighted by 1, 2, 1 weighting coefficients, i.e. the output current from the sub-amplifier 222 in the middle is two (2) times to the output currents from the two sub-amplifiers 221, 223 at each side. The sub-amplifiers 221, 222, 223 are coupled to the output transmission line 230 by coupling circuits, e.g. half wavelength transmission lines and has the correction capability of 10% of the maximum output signal amplitude.

Figure 6A:
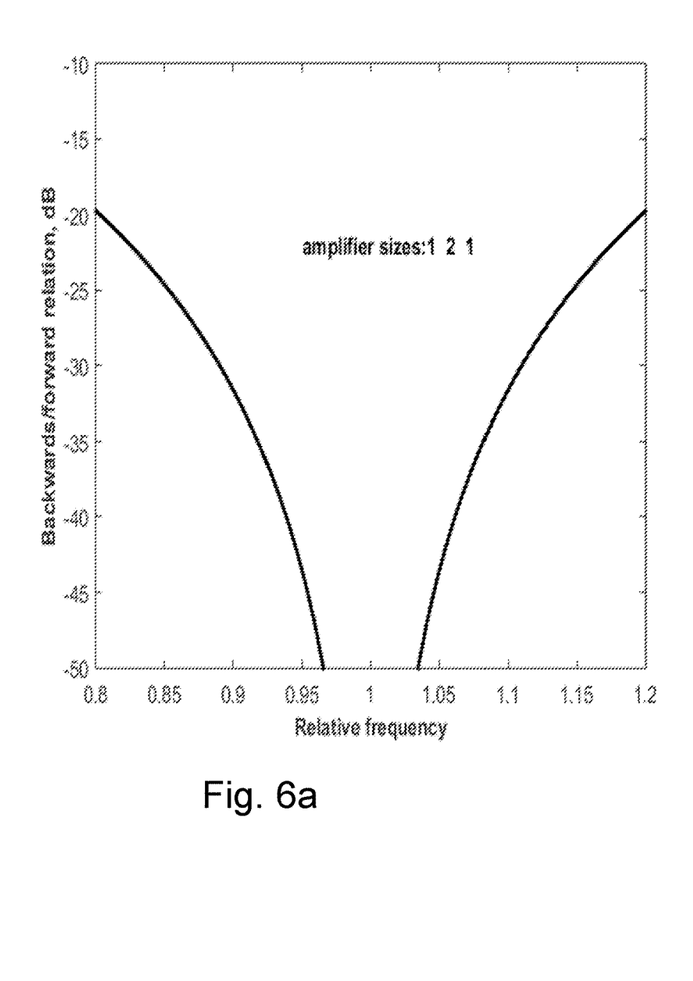
FIG. 6a is a diagram illustrating one example of directivity over the frequency range for the amplifier circuit in FIG. 2.
Figure 6B:
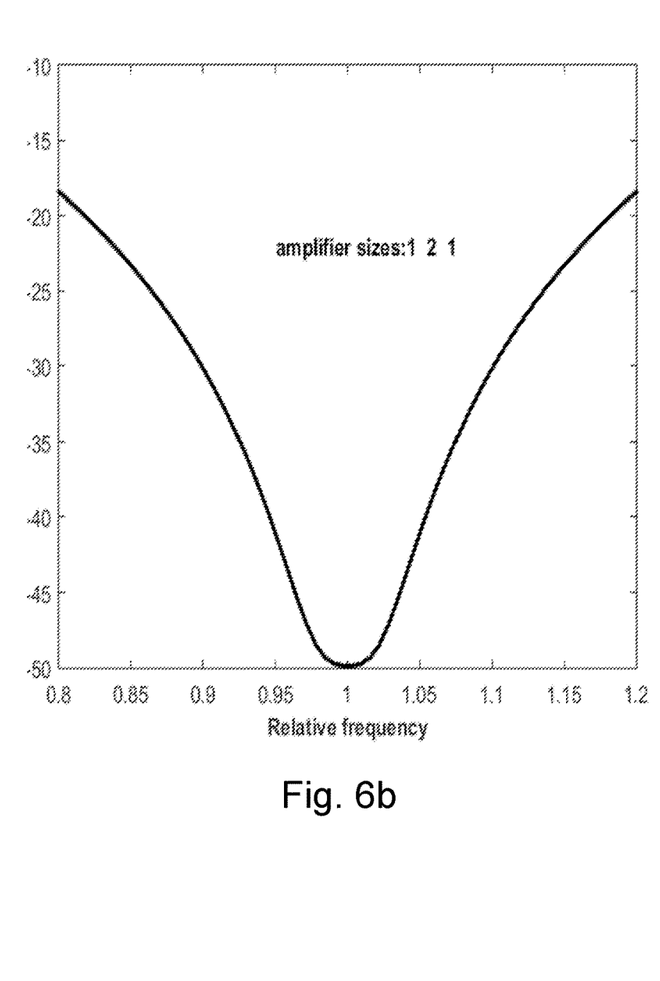
FIG. 6b is a diagram illustrating another example of directivity over the frequency range for the amplifier circuit in FIG. 2.

The directivities over the frequency range are shown in FIGS. 6a and 6b for the amplifier 220 with different combinations of characteristic impedances of the output transmission line 230 and supply voltages to the sub-amplifiers.

FIG. 6a shows one example of the directivity of the amplifier 220, where all segments of the output transmission line 230 have the same characteristic impedance, and the supply voltages for the sub-amplifiers are increased along the output transmission line 230 towards the output port 240. Increasing the supply voltages is to accommodate the increasing output voltage swing that results from increased power adding from the sub-amplifiers to the compensation signal. The relative output voltage swings that the sub-amplifiers 221, 222, 223 may be capable of handling are, for example, 0.9, 0.95 and 1 times of the maximum voltage swing of the compensation signal, respectively.

FIG. 6b shows another example of the directivity of the amplifier 220, where all the sub-amplifiers have the same supply voltage, and the characteristic impedance of the segments of the output transmission line 230 decreases towards the output port 240. In this way, the maximum voltage swing will be kept constant even though the sub-amplifiers each add power to the compensation signal. For example, assuming that the incoming transmission line's characteristic impedance is 1, i.e. the segment between the output 212 of the circuit 210 and sub-amplifier 221, then the impedance for the segment between the two first sub-amplifiers 221, 222 is 94%, for the segment between the next two sub-amplifiers 222, 223 is 84%, and for the outgoing transmission line segment, i.e. between the sub-amplifier 223 and the output port 240 is 80%, of the incoming transmission line's characteristic impedance.

According to another embodiment, a minimal implementation in terms of the number of sub-amplifiers is to use two sub-amplifiers 221, 222 in the amplifier 220, where the output currents from the two sub-amplifiers 221, 222 are equal, i.e. with 1, 1 weighting coefficients. The segments of the input and output transmission lines between the two sub-amplifiers are both quarter wavelengths at the center frequency of the interested frequency band. This minimal implementation still can achieve good directivity over a relative narrower frequency range.

According to some embodiments, the amplifier 220 may also be built with many unit-sized sub-amplifiers with same output current. Then bell-shaping the output currents may be achieved by using more unit-sized sub-amplifiers in the middle and fewer unit-sized sub-amplifiers in each side.

According to some embodiments, if the amplifier 220 is used in very large bandwidths, push-pull coupled transistors may be used in the sub-amplifiers.

Figure 7A:
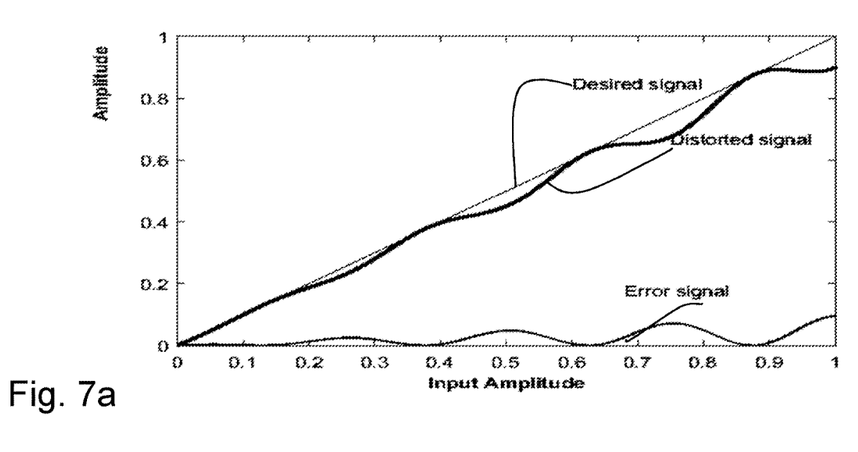
FIG. 7a is a diagram illustrating an example of a distorted output signal and error signal from a circuit.
Figure 7B:
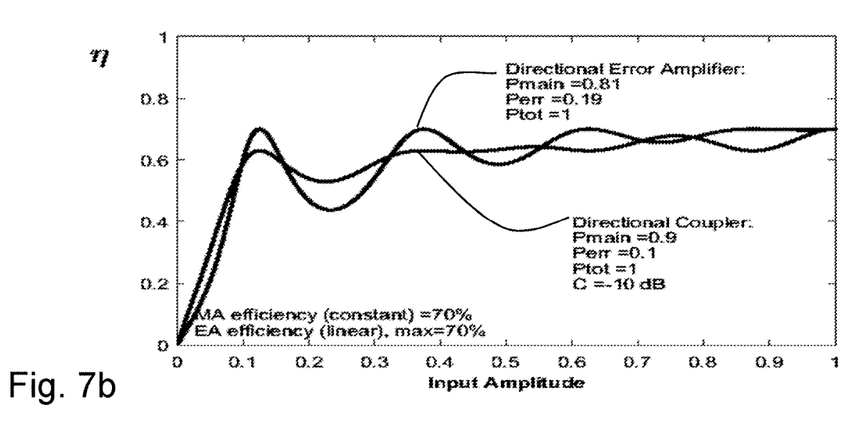
FIG. 7b is a diagram illustrating efficiency curves of the amplifier circuit in FIG. 2 and the conventional coupler-based method.

To illustrate the complementary nature, efficiency-wise, of the amplifier circuit 200 according to embodiments herein and the coupler-based method, the circuit 210 is represented by a main amplifier model with distortion in the negative gain direction at "all" signal amplitudes. The maximum local error is here proportional to the output signal amplitude. FIG. 7a shows the distorted main amplifier output signal and the error signal. FIG. 7b shows the efficiency curves of the amplifier circuit 200 and the conventional coupler-based method.

It can be seen that the conventional method generally has higher efficiency for errors occurring at low output signal amplitudes, whereas the amplifier circuit 200 has higher efficiency for errors occurring at high output signal amplitudes. As shown earlier, the conventional method has low efficiency if it needs capability for large errors, whereas the amplifier circuit 200 has high efficiency for such situations as long as the errors at low output signal amplitudes are small. Although not apparent from FIGS. 7a and 7b, this holds also in general, for errors in quadrature, overshooting errors etc.

Thus, based on the above analysis, the amplifier circuit 200 and the conventional method may in many cases be used together with higher efficiency than either method by itself. In such a combination, the conventional method may have low coupling factor and limited error amplifier size and remove all small errors at low output signal amplitudes. The amplifier circuit 200 may then remove the remaining, larger errors, for example transients and compression. If the amplifier circuit 200 is placed first, the error signal needs to be suppressed, for example by a variable gain amplifier, attenuator, multiplier etc., or use a dead-band circuit in the low amplitude region for small errors.

The amplifier circuit 200 may also be used together with pre-distortion method. Pre-distortion method generally handles distortion at low amplitudes well, but may have trouble with transient phenomena and large compression, which the amplifier circuit 200 handles well. The amplifier circuit 200 may be placed either inside or outside the pre-distortion adaption loop. If the amplifier circuit 200 is placed inside, its error signal needs to be suppressed for efficiency reasons in the low amplitude region for small errors. If the amplifier circuit 200 is placed outside the loop, the pre-distorter may instead be made to ignore compression and transients. It may also be simplified in other ways since the feedforward action of the amplifier circuit 200 handles complicated small-scale errors as well.

Even though embodiments of the various aspects have been described, many different alterations, modifications and the like thereof will become apparent for those skilled in the art. For example, any of the described combinations may of course also be complemented with more stages of error correction as required. The amplifier circuit 200 according to embodiments herein may have different number of sub-amplifiers, may have different output transmission lines with different shape and characteristic impedance, may have different configurations for supply voltages and output currents etc. The described embodiments are therefore not intended to limit the scope of the present disclosure.

Some advantages may be concluded from the described embodiments above. For example, the amplifier circuit 200 according to embodiments herein simultaneously achieves low insertion loss of the transformer coupling method and high backwards isolation of the directional coupler method. This is due to that the amplifier circuit is a directional amplifier which replaces the error amplifier and transformer or directional coupler in a prior art feedforward system. The amplifier circuit comprises multiple sub-amplifiers distributed at different places along the output transmission line. The directivity of the amplifier circuit is achieved by configuring the number of the sub-amplifiers, the output currents of the sub-amplifiers and the way of coupling the sub-amplifiers to the input and output transmission lines. Thus the amplifier circuit has higher efficiency and fewer interaction problems than the prior art transformer coupling method. It also has higher efficiency than the directional coupler method for error signals with high peak-to average power ratio and for hard compression. Further, the cost of over-dimensioning, to safely handle large transient error signal magnitudes is also lower. Since its handling and efficiency characteristics are in many ways complementary to digital pre-distortion and directional coupler-based feedforward method, the amplifier circuit according to embodiments herein may be advantageously combined with both. It may also be used as the only feedforward method in a multistage system.

Figure 8:
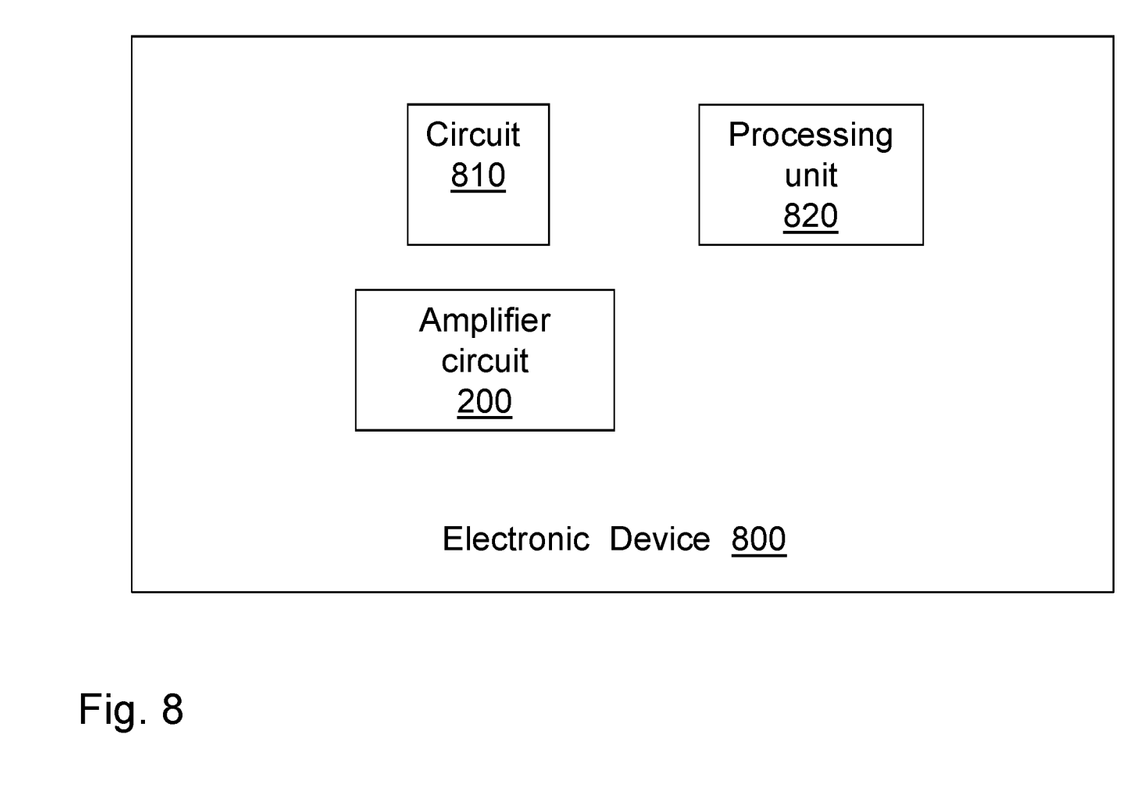
FIG. 8 is a schematic block diagram illustrating an electronic device according to some embodiments.

The amplifier circuit 200 according to embodiments herein may be employed in various circuits in an electronic device. FIG. 8 shows a schematic block diagram illustrating an electronic device 800, which may be, e.g. a radio frequency transceiver, a wireless communication device, a user equipment, a mobile device, a base station or a radio network node etc., in a wireless communication systems, or any general electronic systems or equipments, in which an output signal from a circuit needs to be corrected or compensated. The electronic device 800 comprises a circuit 810, which may be a power amplifier, a mixer, a filter, a modulator etc., where its output signal is corrected or compensated by the amplifier circuit 200. The electronic device 800 may comprise other units, such as a processing unit 820 or the like.

When using the word "comprise" or "comprising" it shall be interpreted as non-limiting, i.e. meaning "consist at least of".

The embodiments herein are not limited to the above described embodiments. Various alternatives, modifications and equivalents may be used. Therefore, the above embodiments should not be taken as limiting the scope of the invention, which is defined by the appending claims.

The invention claimed is:

1. An amplifier circuit for compensating an output signal provided at an output of a circuit, the amplifier circuit comprising:
    an output transmission line connected between the output of the circuit and an output port;
    an amplifier comprising multiple sub-amplifiers for amplifying an error signal into compensation signals;
    wherein inputs of the multiple sub-amplifiers are coupled to an input transmission line at different places with a distance between the different places along the input transmission line for receiving the error signal derived from a reference input signal and the output signal of the circuit; and
    wherein outputs of the multiple sub-amplifiers are coupled to the output transmission line at different places with a distance between the different places along the output transmission line to inject the compensation signals to the output port.

2. The amplifier circuit of claim 1, wherein the multiple sub-amplifiers are further configured to reduce backwards traveling of the compensation signal to the output of the circuit by configuring the number of sub-amplifiers, output currents from the multiple sub-amplifiers, and the distance between the different places along the output transmission line.

3. The amplifier circuit of claim 1, wherein the distance between the different places along the output transmission line is a quarter wavelength at a center frequency of operating frequency band of the circuit.

4. The amplifier circuit of claim 1, wherein the outputs of the multiple sub-amplifiers are connected directly to the output transmission line.

5. The amplifier circuit of claim 1, wherein output currents from the multiple sub-amplifiers are bell-shape weighted according to a window function.

6. The amplifier circuit of claim 5, wherein the window function is any one of Dolph-Chebyshev, Gaussian, Binomial, Hamming, or Blackman functions, or a combination thereof.

7. The amplifier circuit of claim 1:
    wherein segments of the output transmission line between the sub-amplifiers have the same characteristic impedance; and
    wherein supply voltages for the sub-amplifiers are increased along the output transmission line towards the output port.

8. The amplifier circuit of claim 1:
    wherein the sub-amplifiers have same supply voltage; and
    wherein characteristic impedance of segments of the output transmission line between the sub-amplifiers decreases along the output transmission line towards the output port.

9. The amplifier circuit of claim 1, wherein the sub-amplifiers are unit-sized sub-amplifiers with same output current, or have discrete, small-integer sizes.

10. An electronic device, comprising:
    an amplifier circuit for compensating an output signal provided at an output of a circuit, the amplifier circuit comprising:
        an output transmission line connected between the output of the circuit and an output port;
        an amplifier comprising multiple sub-amplifiers for amplifying an error signal into compensation signals;
        wherein inputs of the multiple sub-amplifiers are coupled to an input transmission line at different places with a distance between the different places along the input transmission line for receiving the error signal derived from a reference input signal and the output signal of the circuit; and
        wherein outputs of the multiple sub-amplifiers are coupled to the output transmission line at different places with a distance between the different places along the output transmission line to inject the compensation signals to the output port.

11. The electronic device of claim 10, wherein the electronic device is a radio frequency transceiver, a wireless communication device, a user equipment, a mobile device, a base station, or a radio network node.

* * * * *

UNITED STATES PATENT AND TRADEMARK OFFICE
CERTIFICATE OF CORRECTION

PATENT NO. : 10,469,034 B2
APPLICATION NO. : 15/767384
DATED : November 5, 2019
INVENTOR(S) : Richard Hellberg Page 1 of 1

It is certified that error appears in the above-identified patent and that said Letters Patent is hereby corrected as shown below:

In the Specification

In Column 3, Line 7, delete "→3a".

In Column 3, Lines 55-61, delete "transmission line for receiving an error signal, and outputs of the multiple sub-amplifiers are coupled at respective places along the output transmission line to inject a compensation signal to the output port. The error signal is derived from a reference input signal and the output signal of the circuit, and the error signal is amplified in the amplifier into the compensation signal." and insert the same at Line 21 after "input" as a continuation paragraph.

In Column 5, Line 20, delete "show" and insert -- shown --, therefor.

In Column 5, Line 50, delete "According" and insert -- According to --, therefor.

Signed and Sealed this
Nineteenth Day of May, 2020

Andrei Iancu
*Director of the United States Patent and Trademark Office*